(12) United States Patent
Chen et al.

(10) Patent No.: US 9,614,054 B2
(45) Date of Patent: Apr. 4, 2017

(54) METHOD OF FORMING A VERTICAL DEVICE

(71) Applicant: Taiwan Semiconductor Manufacturing Company Limited, Hsinchu (TW)

(72) Inventors: De-Fang Chen, Hsinchu (TW);
Teng-Chun Tsai, Hsinchu (TW);
Cheng-Tung Lin, Hsinchu (TW);
Li-Ting Wang, Hsinchu (TW);
Chun-Hung Lee, Hsinchu (TW);
Ming-Ching Chang, Hsinchu (TW);
Huan-Just Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/979,831

(22) Filed: Dec. 28, 2015

(65) Prior Publication Data
US 2016/0111523 A1    Apr. 21, 2016

Related U.S. Application Data

(62) Division of application No. 14/179,983, filed on Feb. 13, 2014, now Pat. No. 9,224,833.

(51) Int. Cl.
| | | |
|---|---|---|
| *H01L 21/311* | (2006.01) | |
| *H01L 29/66* | (2006.01) | |
| *H01L 29/78* | (2006.01) | |
| *H01L 21/306* | (2006.01) | |
| *H01L 21/8234* | (2006.01) | |
| *H01L 21/8238* | (2006.01) | |
| *H01L 21/3065* | (2006.01) | |
| *H01L 21/308* | (2006.01) | |
| *H01L 21/762* | (2006.01) | |

(52) U.S. Cl.
CPC .... *H01L 29/66666* (2013.01); *H01L 21/3065* (2013.01); *H01L 21/3085* (2013.01); *H01L 21/30625* (2013.01); *H01L 21/31116* (2013.01); *H01L 21/823487* (2013.01); *H01L 21/823885* (2013.01); *H01L 29/7827* (2013.01); *H01L 21/76224* (2013.01)

(58) Field of Classification Search
CPC ........... H01L 21/0337; H01L 21/30625; H01L 21/823431; H01L 21/823821; H01L 21/845

See application file for complete search history.

(56) References Cited

U.S. PATENT DOCUMENTS

| 2010/0163971 A1* | 7/2010 | Hung ................ H01L 29/66795 257/327 |
| 2015/0200297 A1 | 7/2015 | Lee et al. |

* cited by examiner

*Primary Examiner* — Hoai V Pham
(74) *Attorney, Agent, or Firm* — Jones Day

(57) ABSTRACT

According to an exemplary embodiment, a method of forming a vertical device is provided. The method includes: providing a protrusion over a substrate; forming an etch stop layer over the protrusion; laterally etching a sidewall of the etch stop layer; forming an insulating layer over the etch stop layer; forming a film layer over the insulating layer and the etch stop layer; performing chemical mechanical polishing on the film layer and exposing the etch stop layer; etching a portion of the etch stop layer to expose a top surface of the protrusion; forming an oxide layer over the protrusion and the film layer; and performing chemical mechanical polishing on the oxide layer and exposing the film layer.

20 Claims, 37 Drawing Sheets

100

100

1100

1100

1100

1100

2300

2300

2300

2300

2300

METHOD OF FORMING A VERTICAL DEVICE

CROSS-REFERENCE TO RELATED APPLICATIONS

This application is a divisional application of U.S. patent application Ser. No. 14/179,983, entitled "METHOD OF FORMING A VERTICAL DEVICE," filed Feb. 13, 2014, which is incorporated herein by reference in its entirety.

BACKGROUND

In the advanced technology, it is a challenge to etch-back metal gates during manufacturing semiconductor devices due to no selectivity between salicide and metal gates. Therefore, there is a need to deal with said etch-back and facilitate the manufacture of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
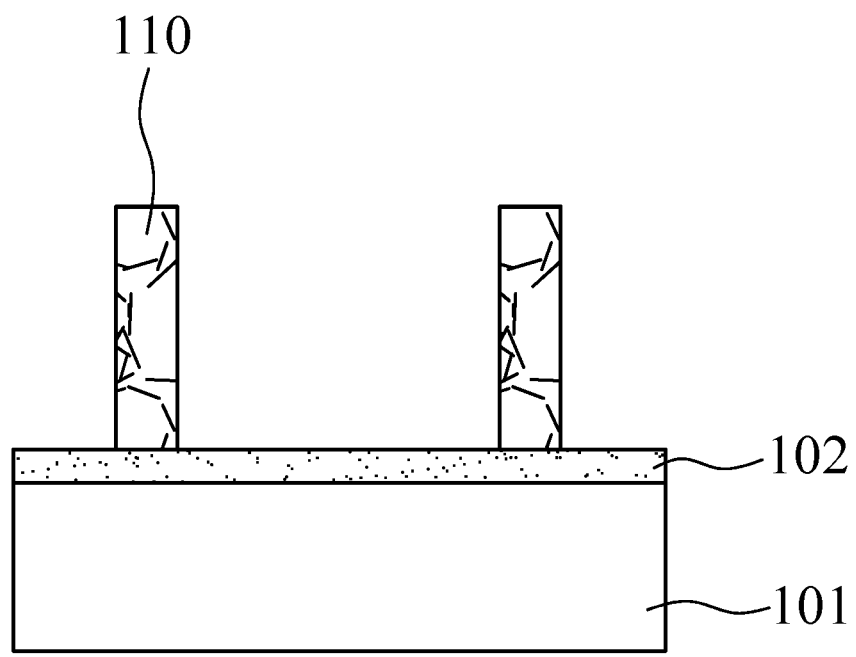
FIG. 1 is a sectional view illustrating an exemplary semiconductor device according to an exemplary embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a self-aligned method which may form a hard mask on the top of a vertical structure as a stop layer to protect underlying layers for subsequent processes, for example, forming and patterning work function metal layers or metal gate layers. It can be implemented in any process flow such as vertical gate-all-around (VGAA), and may require less stringent lithography process.

The method may be realized by several VGAA procedures, including (1) to provide a vertical structure having a source layer, a channel layer and a drain layer, then to provide a hard mask formed of a dielectric layer over the vertical structure, further to remove the hard mask and to form a gate layer substantially surrounding the channel layer; (2) to provide a vertical structure having a source layer and a channel layer, then to provide a hard mask formed of a dielectric layer over the vertical structure, further to remove the hard mask, to form a drain layer over the channel layer and to form a gate layer substantially surrounding the channel layer.

The hard mask formed of the dielectric layer may protect the layers in the vertical structure, for example, salicide metal formed of Ti or TiN, during a metal gate etch back process (MGEB) in the VGAA procedures. Additionally, the source layer, the channel layer and the drain layer of the VGAA may be formed of Si, SiGe, Ge, III-V (InP, GaAs, AlAs, InAs, InAlAs, InGaAs, InSb, GaSb, InGaSb) and the said materials with a n-type dopant or a p-type dopant.

FIG. 1 is a sectional view illustrating an exemplary semiconductor device according to an exemplary embodiment. As shown in FIG. 1, a semiconductor device 100 is provided. In the semiconductor device 100, a first vertical structure 110 is provided over a substrate 101. The first vertical structure 110 may be a vertical-gate-all-around device. The first vertical structure 110 may be a PMOS or a NMOS. Additionally, a dielectric layer 102 may be formed over the substrate 101.

Figure 2:
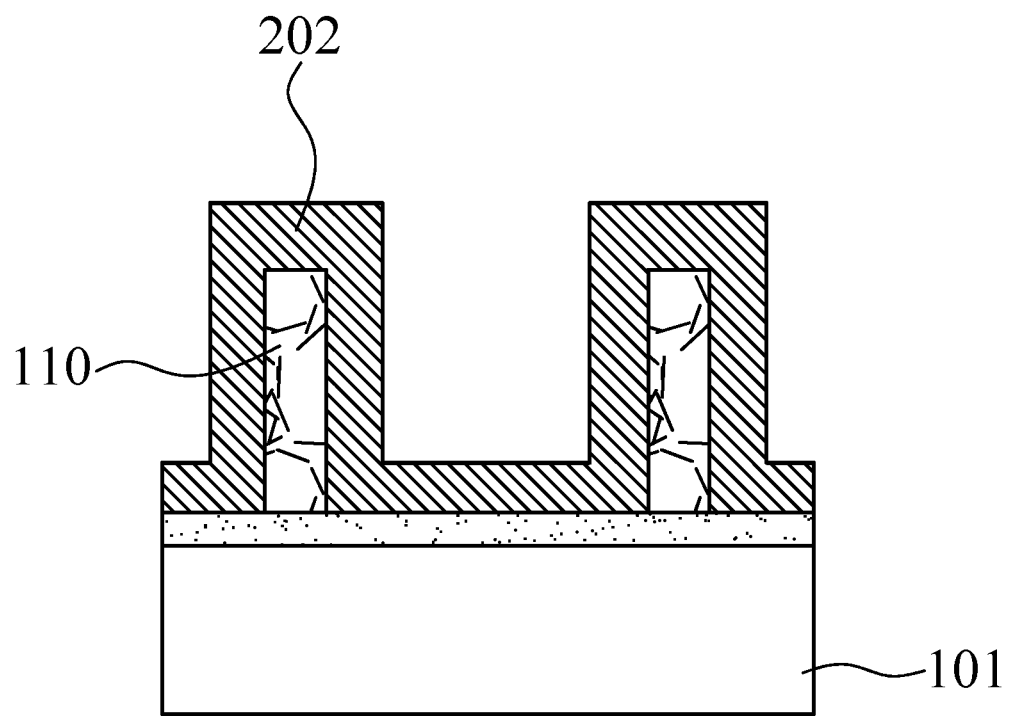
FIG. 2 is a sectional view illustrating the exemplary semiconductor device according to the exemplary embodiment.

FIG. 2 is a sectional view illustrating the exemplary semiconductor device according to the exemplary embodiment. As shown in FIG. 2, a first dielectric layer 202 is formed over the vertical structure 110 and the substrate 101. The first dielectric layer 202 may be formed of at least one of oxide, SiN, SiON, SiC, SiCN and SiOCN. The first dielectric layer 202 may have a thickness of about 5-40 nanometers.

Figure 3:
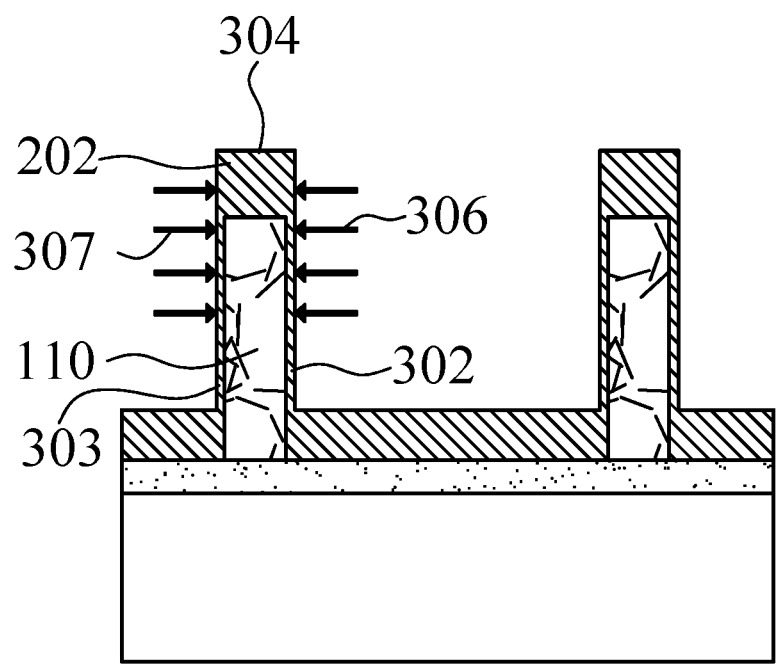
FIG. 3 is a sectional view illustrating the exemplary semiconductor device according to the exemplary embodiment.

FIG. 3 is a sectional view illustrating the exemplary semiconductor device according to the exemplary embodiment. As shown in FIG. 3, sidewalls 302, 303 of the first dielectric layer 202 are trimmed by a lateral etching process. In the lateral etching process, a polymer layer (not shown) may be formed over the portion 304 of the first dielectric layer 202 above the top of the vertical structure 110 by using a polymer gas, and the sidewalls 302, 303 of the first dielectric layer 202 are respectively laterally etched with lateral plasma power 306, 307.

Continuing from FIG. 3, details of the procedure of replacing a portion of the first dielectric layer 202 over the vertical structure 110 with a second dielectric layer will be described in FIGS. 4-9 hereafter.

Figure 4:
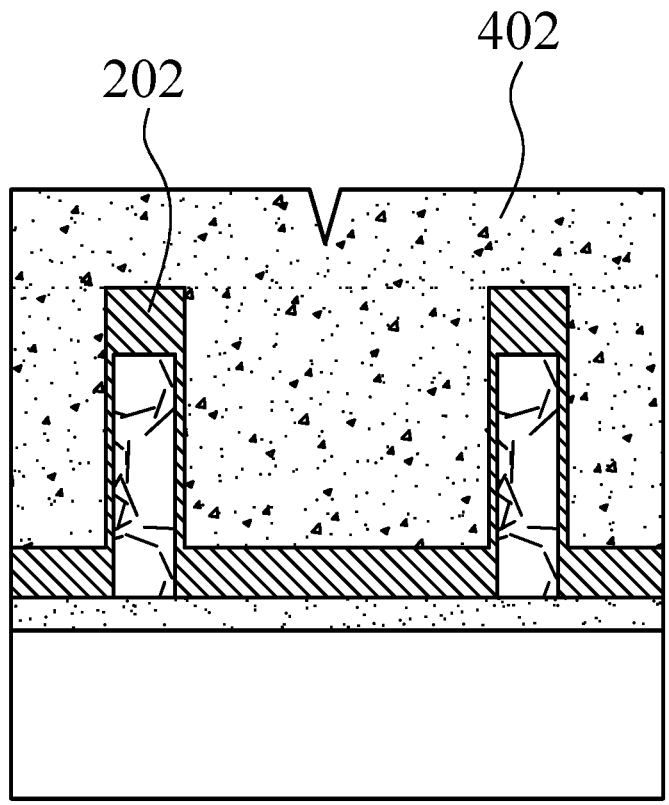
FIG. 4 is a sectional view illustrating the exemplary semiconductor device according to the exemplary embodiment.

FIG. 4 is a sectional view illustrating the exemplary semiconductor device according to the exemplary embodiment. As shown in FIG. 4, a first film layer 402 is formed over the first dielectric layer 202. The first film layer 402 may be formed of at least one of poly and an ashable amorphous carbon film.

Figure 5:
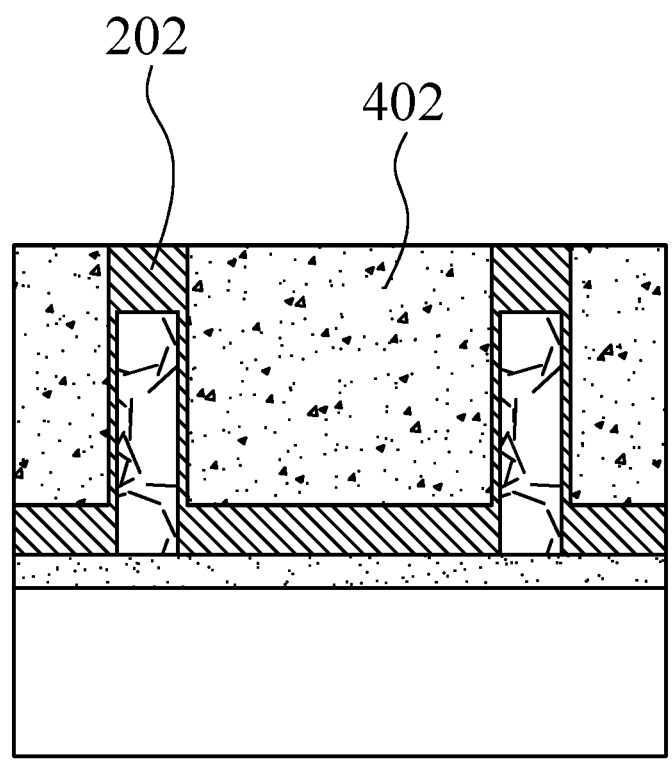
FIG. 5 is a sectional view illustrating the exemplary semiconductor device according to the exemplary embodiment.

FIG. 5 is a sectional view illustrating the exemplary semiconductor device according to the exemplary embodiment. As shown in FIG. 5, a chemical mechanical polishing is performed on the first film layer 402 and stops on the first dielectric layer 202.

Figure 6:
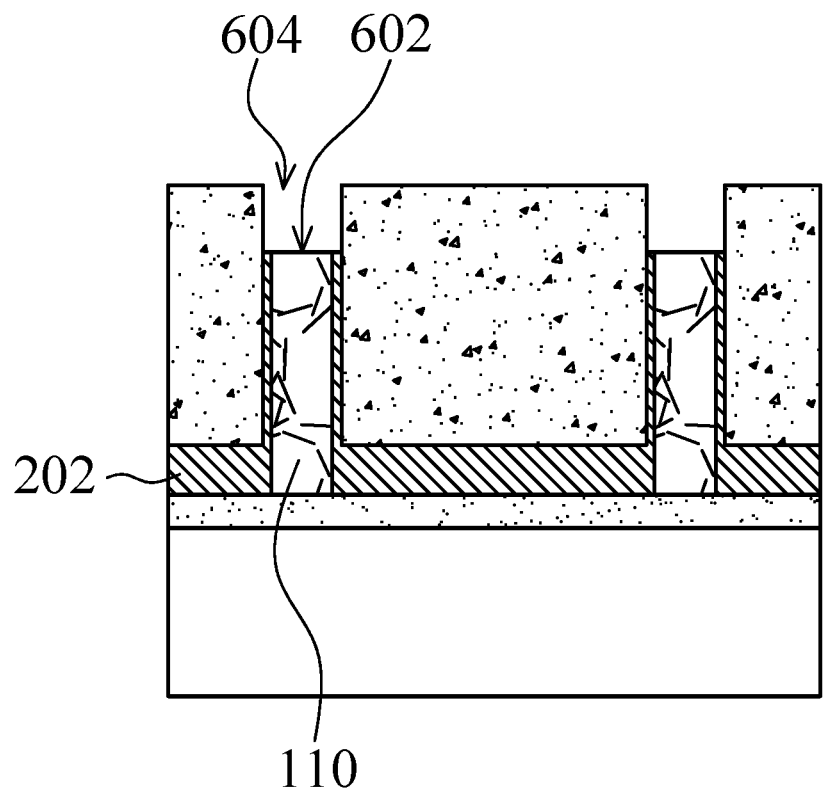
FIG. 6 is a sectional view illustrating the exemplary semiconductor device according to the exemplary embodiment.

FIG. 6 is a sectional view illustrating the exemplary semiconductor device according to the exemplary embodiment. As shown in FIG. 6, a wet etching process is performed on a portion of the first dielectric layer 202 to expose a top surface 602 of the vertical structure 110 and to form a recess 604.

Figure 7:
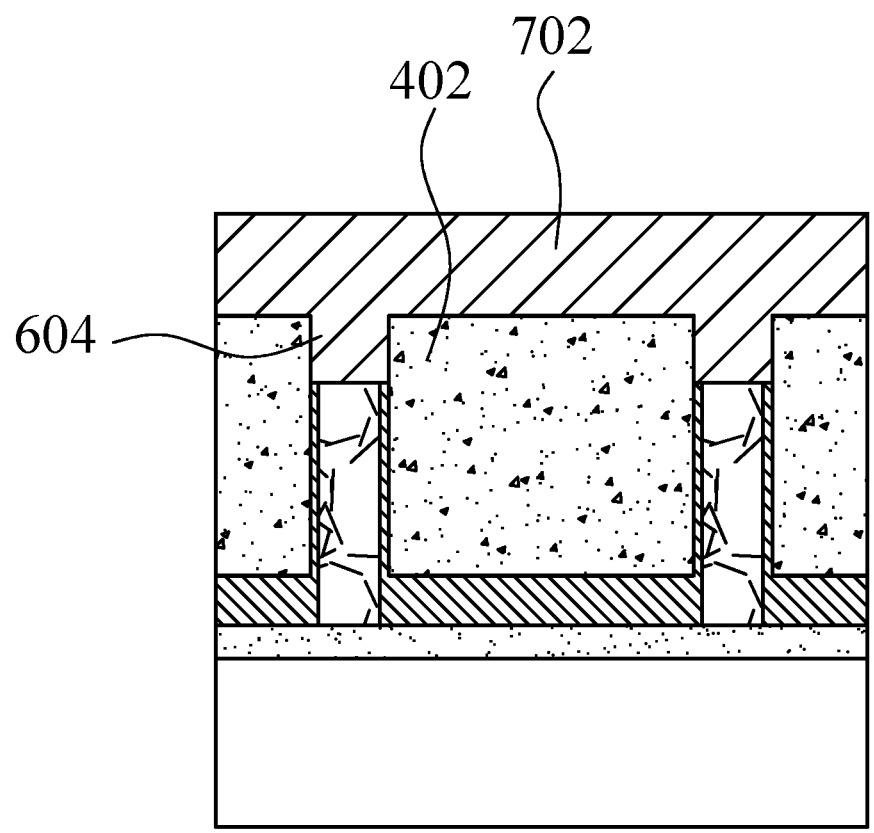
FIG. 7 is a sectional view illustrating the exemplary semiconductor device according to the exemplary embodiment.

FIG. 7 is a sectional view illustrating an exemplary semiconductor device according to an exemplary embodiment. As shown in FIG. 7, a second dielectric layer 702 is formed over the first film layer 402 and in the recess 604. The second dielectric layer 702 may be formed of at least one of oxide, SiN, SiON, SiC, SiCN and SiOCN.

Figure 8:
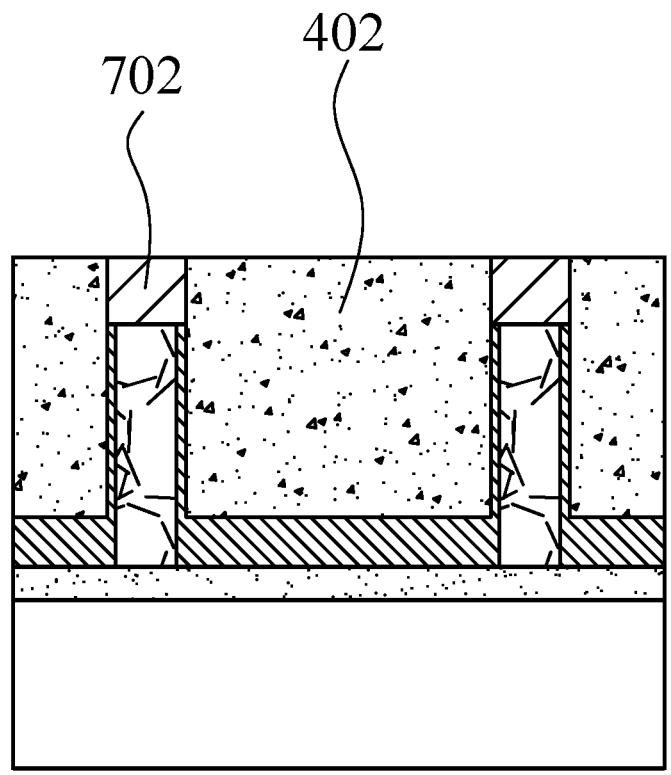
FIG. 8 is a sectional view illustrating the exemplary semiconductor device according to the exemplary embodiment.

FIG. 8 is a sectional view illustrating the exemplary semiconductor device according to the exemplary embodiment. As shown in FIG. 8, a chemical mechanical polishing is performed on the second dielectric layer 702 and stops on the first film layer 402.

Figure 9:
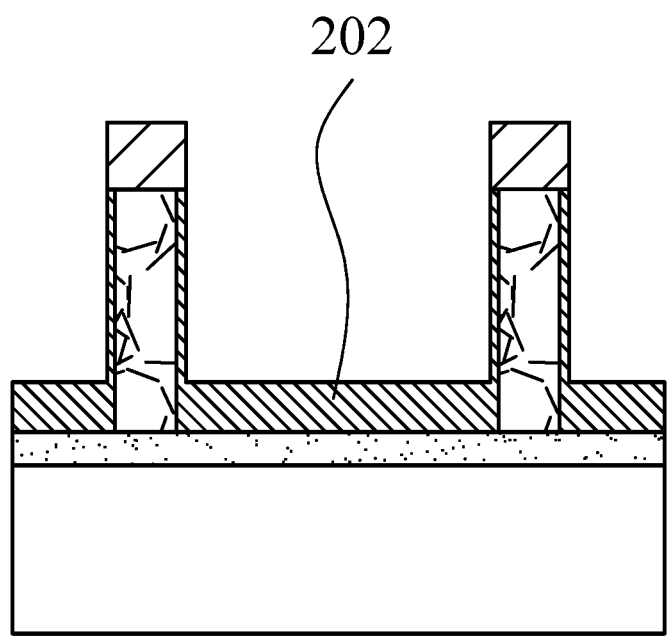
FIG. 9 is a sectional view illustrating the exemplary semiconductor device according to the exemplary embodiment.

FIG. 9 is a sectional view illustrating the exemplary semiconductor device according to the exemplary embodiment. As shown in FIG. 9, a wet etching process is performed on the first film layer (not shown) to expose the first dielectric layer 202.

Figure 10:
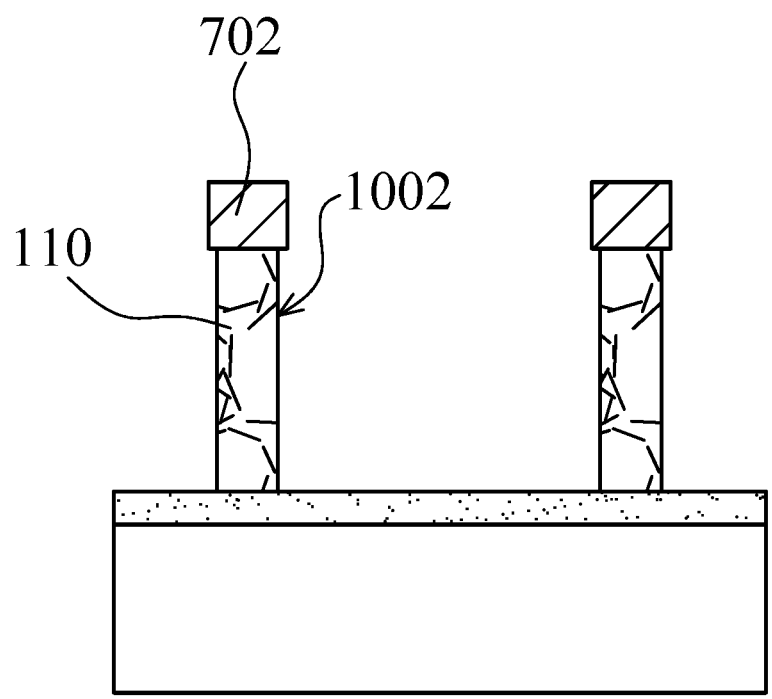
FIG. 10 is a sectional view illustrating the exemplary semiconductor device according to the exemplary embodiment.

FIG. 10 is a sectional view illustrating the exemplary semiconductor device according to the exemplary embodiment. As shown in FIG. 10, a wet etching process is performed on the first dielectric layer (not shown) to expose the lateral surface 1002 of the vertical structure 110. As such, the second dielectric layer 702 is formed on the top of the vertical structure 110. The second dielectric layer 702 is self-aligned to the vertical structure 110 and may be formed as a hard mask on the top of the vertical structure 110 to protect underlying layers for subsequent processes, for example, forming and patterning work function metal layers or metal gate layers. Furthermore, by using a proper etchant, the hard mask may be easily removed by a wet etching process.

Figure 11:
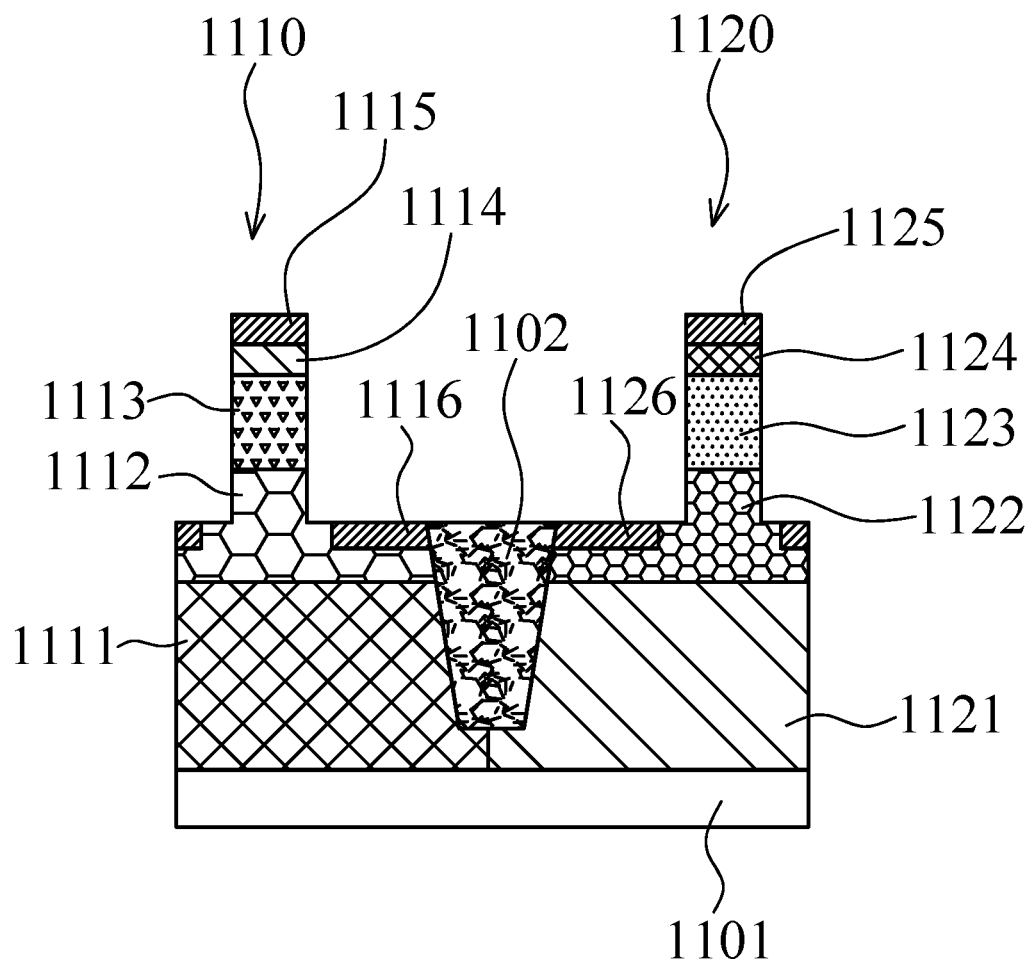
FIG. 11 is a sectional view illustrating an exemplary semiconductor device according to an exemplary embodiment.

FIG. 11 is a sectional view illustrating an exemplary semiconductor device according to an exemplary embodiment. As shown in FIG. 11, a semiconductor device 1100 is provided. In the semiconductor device 1100, a first vertical structure 1110 and a second vertical structure 1120 are provided over a substrate 1101. The first vertical structure 1110 and the second vertical structure 1120 may be vertical-gate-all-around devices electrically isolated by a shallow trench isolation 1102. The first vertical structure 1110 may be a PMOS, and may include an n-well 1111, a first source 1112, a first channel 1113 and a first drain 1114. The second vertical structure 1120 may be a NMOS, and may include a p-well 1121, a second source 1122, a second channel 1123 and a second drain 1124. Salicides 1115, 1116, 1125, 1126 are used to reduce contact resistance.

The first source 1112 may be disposed over the n-well 1111. The first channel 1113 may be disposed over the first source 1112. The first drain 1114 may be disposed over the first channel 1113. The second source 1122 may be disposed over the p-well 1121. The second channel 1123 may be disposed over the second source 1122. The second drain 1124 may be disposed over the second channel 1123. The following procedures may be performed on the first vertical structure 1110 and the second vertical structure 1120, and the details for the second vertical structure 1120 is not repeated herein.

Figure 12:
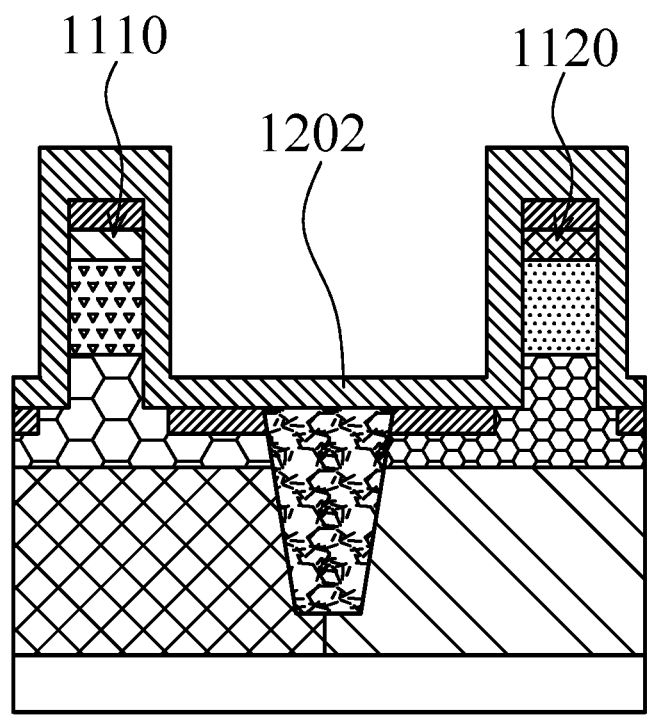
FIG. 12 is a sectional view illustrating the exemplary semiconductor device according to the exemplary embodiment.

FIG. 12 is a sectional view illustrating the exemplary semiconductor device according to the exemplary embodiment. As shown in FIG. 12, an etch stop layer 1202 is formed over the first vertical structure 1110 and the second vertical structure 1120. The etch stop layer 1202 may be formed of SiN. The etch stop layer 1202 may have a thickness of about 5-40 nanometers.

Figure 13:
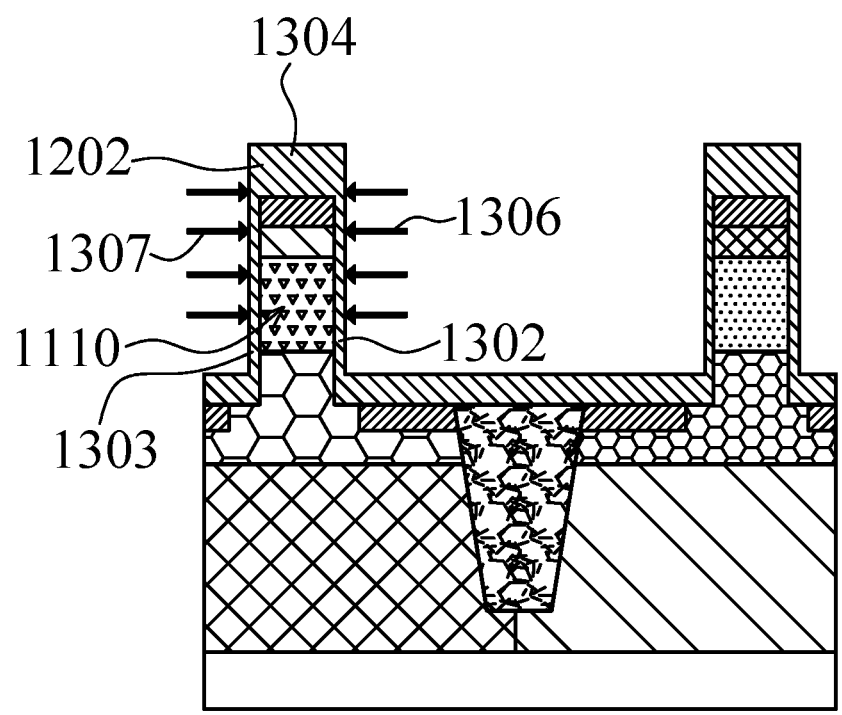
FIG. 13 is a sectional view illustrating the exemplary semiconductor device according to the exemplary embodiment.

FIG. 13 is a sectional view illustrating the exemplary semiconductor device according to the exemplary embodiment. As shown in FIG. 13, sidewalls 1302, 1303 of the etch stop layer 1202 are trimmed by a lateral etching process. In the lateral etching process, a polymer layer (not shown) may be formed over the portion 1304 of the etch stop layer 1202 above the top of the first vertical structure 1110 by using a polymer gas, and the sidewalls 1302, 1303 of the etch stop layer 1202 are respectively laterally etched with lateral plasma power 1306, 1307.

Figure 14:
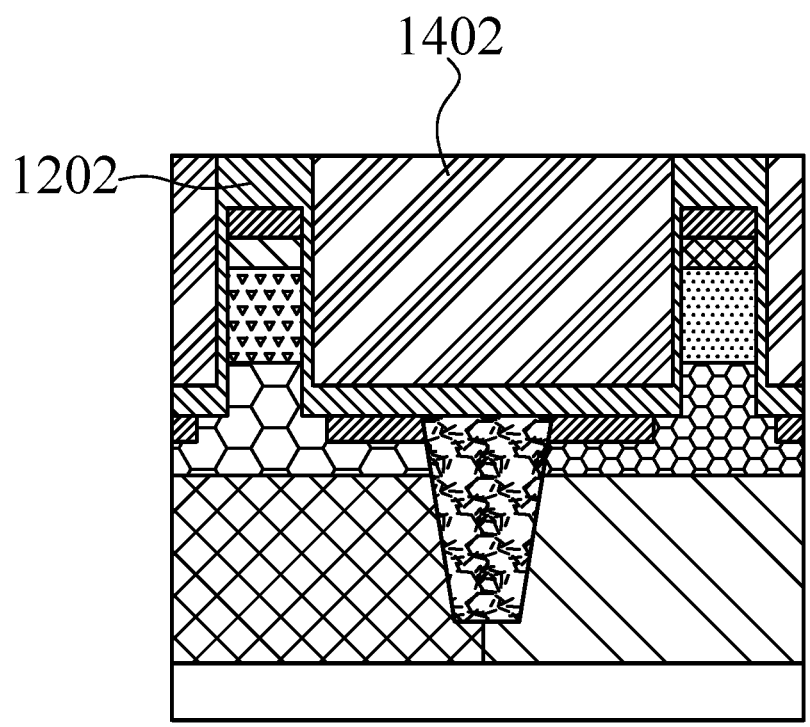
FIG. 14 is a sectional view illustrating the exemplary semiconductor device according to the exemplary embodiment.

FIG. 14 is a sectional view illustrating the exemplary semiconductor device according to the exemplary embodiment. As shown in FIG. 14, a first oxide layer 1402 is formed over the etch stop layer 1202. Then, a chemical mechanical polishing is performed on the first oxide layer 1402 and stops on the etch stop layer 1202.

Figure 15:
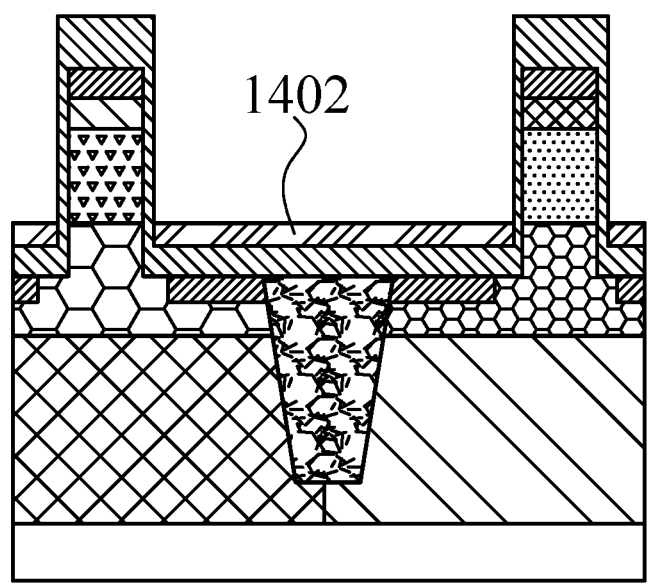
FIG. 15 is a sectional view illustrating the exemplary semiconductor device according to the exemplary embodiment.

FIG. 15 is a sectional view illustrating the exemplary semiconductor device according to the exemplary embodiment. As shown in FIG. 15, a dry etching back process a wet etching is performed on the first oxide layer 1402. The remaining portion of the first oxide layer 1402 is used as a bottom isolation layer.

Figure 16:
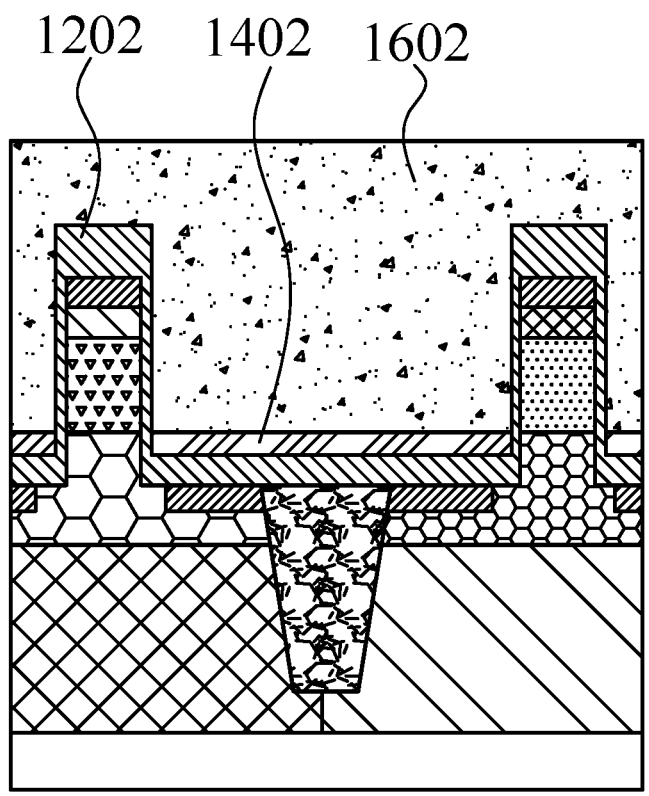
FIG. 16 is a sectional view illustrating the exemplary semiconductor device according to the exemplary embodiment.

FIG. 16 is a sectional view illustrating an exemplary semiconductor device according to an exemplary embodiment. As shown in FIG. 16, a first film layer 1602 is formed over the first oxide layer 1402 and the etch stop layer 1202.

The first film layer 1602 may be formed of at least one of poly and an ashable amorphous carbon film.

Figure 17:
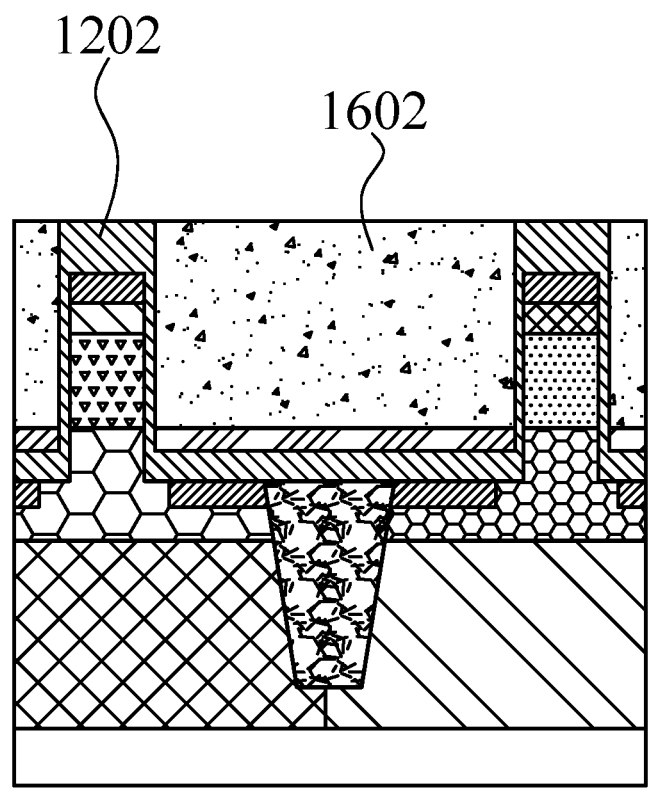
FIG. 17 is a sectional view illustrating the exemplary semiconductor device according to the exemplary embodiment.

FIG. 17 is a sectional view illustrating the exemplary semiconductor device according to the exemplary embodiment. As shown in FIG. 17, a chemical mechanical polishing is performed on the first film layer 1602 and stops on the etch stop layer 1202.

Figure 18:
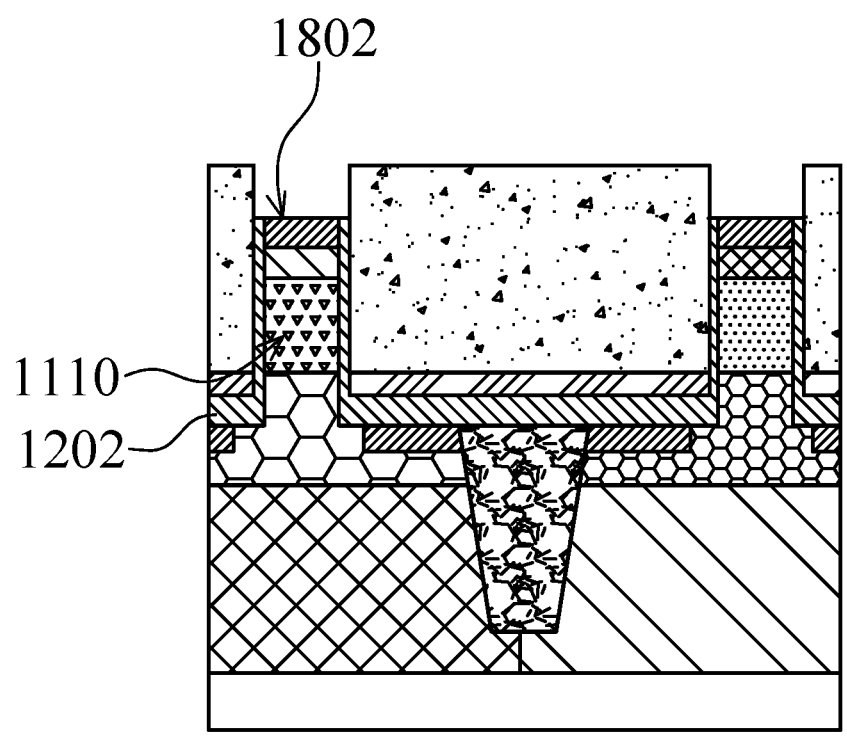
FIG. 18 is a sectional view illustrating the exemplary semiconductor device according to the exemplary embodiment.

FIG. 18 is a sectional view illustrating the exemplary semiconductor device according to the exemplary embodiment. As shown in FIG. 18, a wet etching process is performed on a portion of the etch stop layer 1202 to expose a top surface 1802 of the first vertical structure 1110.

Figure 19:
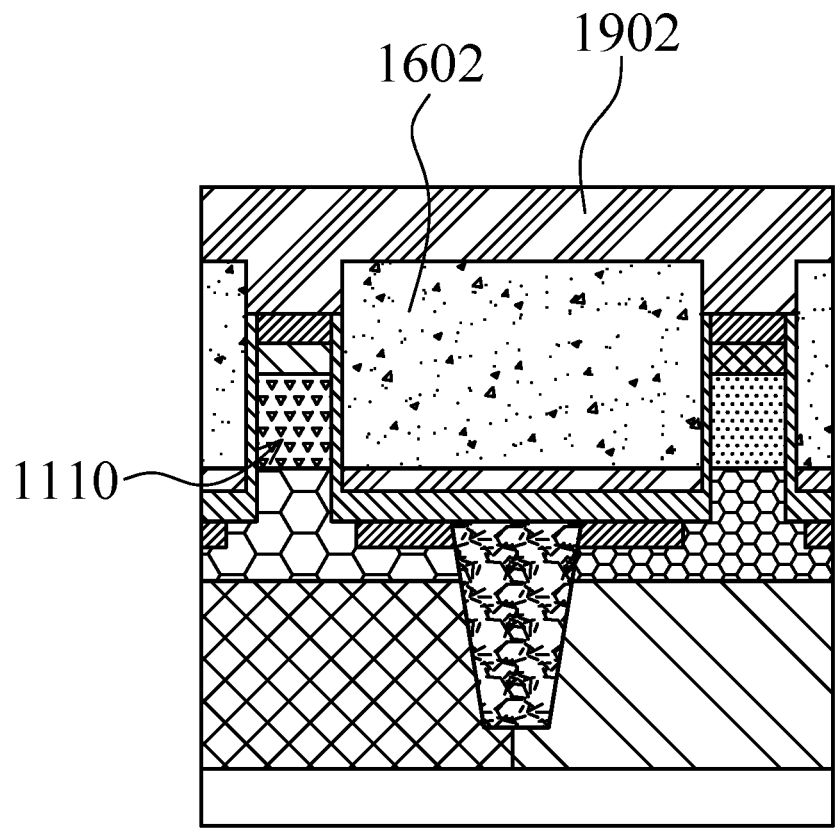
FIG. 19 is a sectional view illustrating the exemplary semiconductor device according to the exemplary embodiment.

FIG. 19 is a sectional view illustrating the exemplary semiconductor device according to the exemplary embodiment. As shown in FIG. 19, a second oxide layer 1902 is formed over the first film layer 1602 and the first vertical structure 1110.

Figure 20:
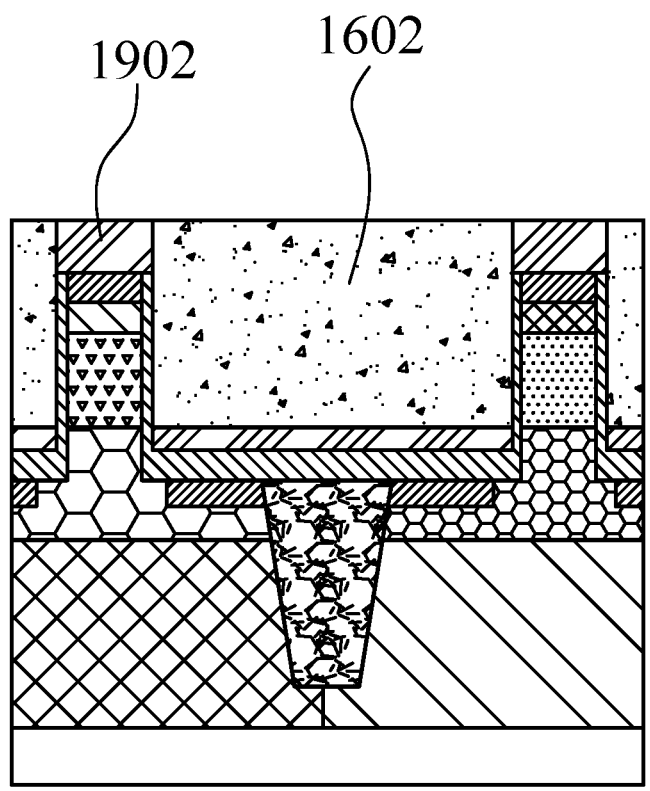
FIG. 20 is a sectional view illustrating the exemplary semiconductor device according to the exemplary embodiment.

FIG. 20 is a sectional view illustrating the exemplary semiconductor device according to the exemplary embodiment. As shown in FIG. 20, a chemical mechanical polishing is performed on the second oxide layer 1902 and stops on the first film layer 1602.

Figure 21:
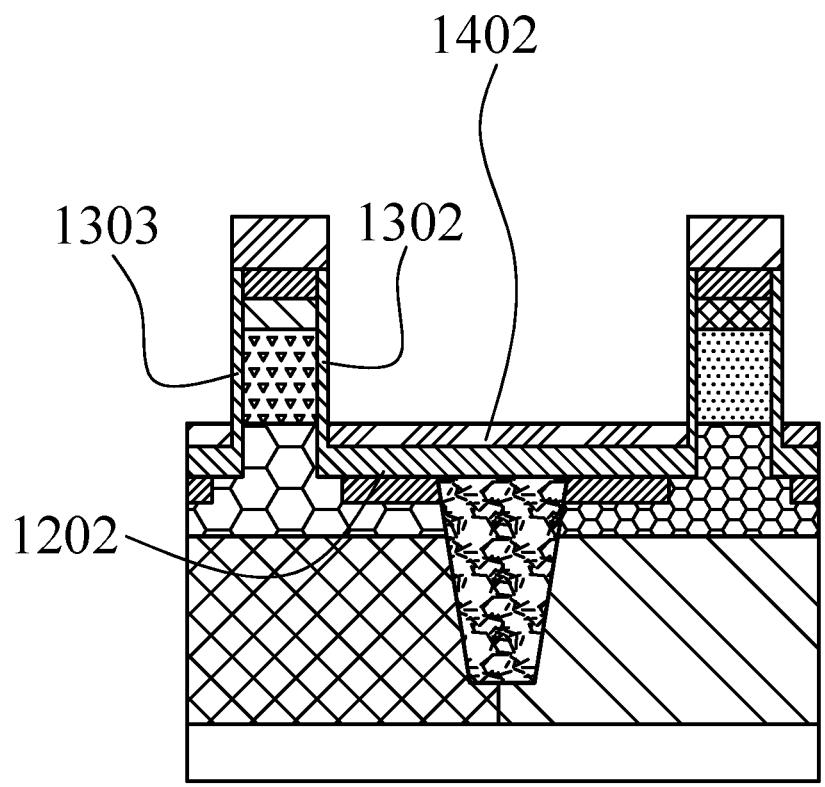
FIG. 21 is a sectional view illustrating the exemplary semiconductor device according to the exemplary embodiment.

FIG. 21 is a sectional view illustrating the exemplary semiconductor device according to the exemplary embodiment. As shown in FIG. 21, a wet etching process is performed on the first film layer (not shown) to expose the sidewalls 1302, 1303 of the etch stop layer 1202 and the first oxide layer 1402.

Figure 22:
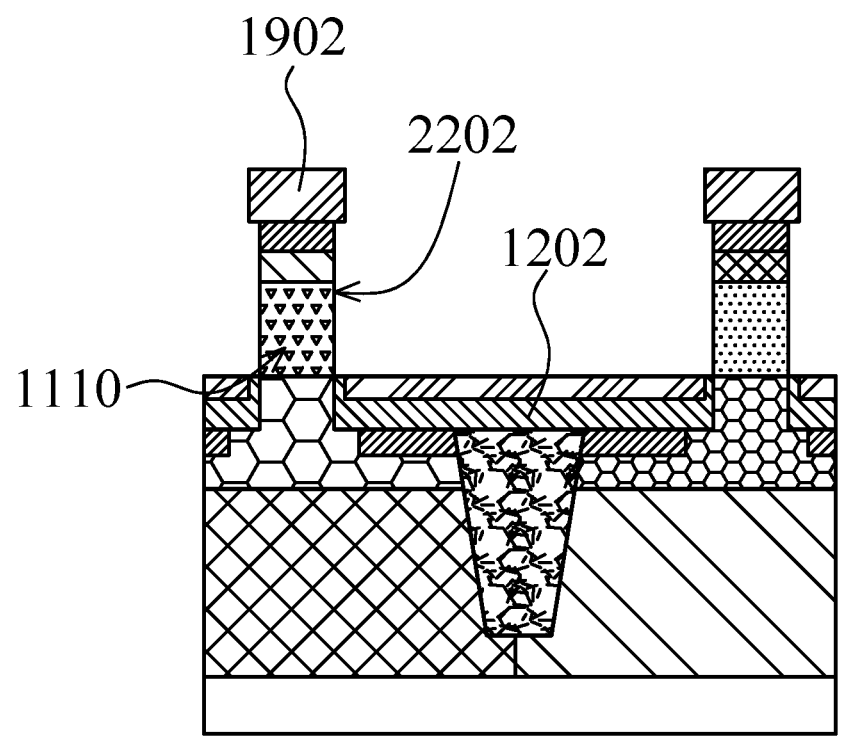
FIG. 22 is a sectional view illustrating the exemplary semiconductor device according to the exemplary embodiment.

FIG. 22 is a sectional view illustrating the exemplary semiconductor device according to the exemplary embodiment. As shown in FIG. 22, a wet etching process is performed on the sidewalls (not shown) of the etch stop layer 1202 to expose the lateral surface 2202 of the vertical structure 1110. As such, the second oxide layer 1902 is formed on the top of the vertical structure 1110. The second oxide layer 1902 is self-aligned to the vertical structure 1110 and may be formed as a hard mask on the top of the vertical structure 1110 to protect underlying layers for subsequent processes, for example, forming and patterning work function metal layers or metal gate layers. Furthermore, by using a proper etchant, the hard mask may be easily removed by a wet etching process.

Figure 23:
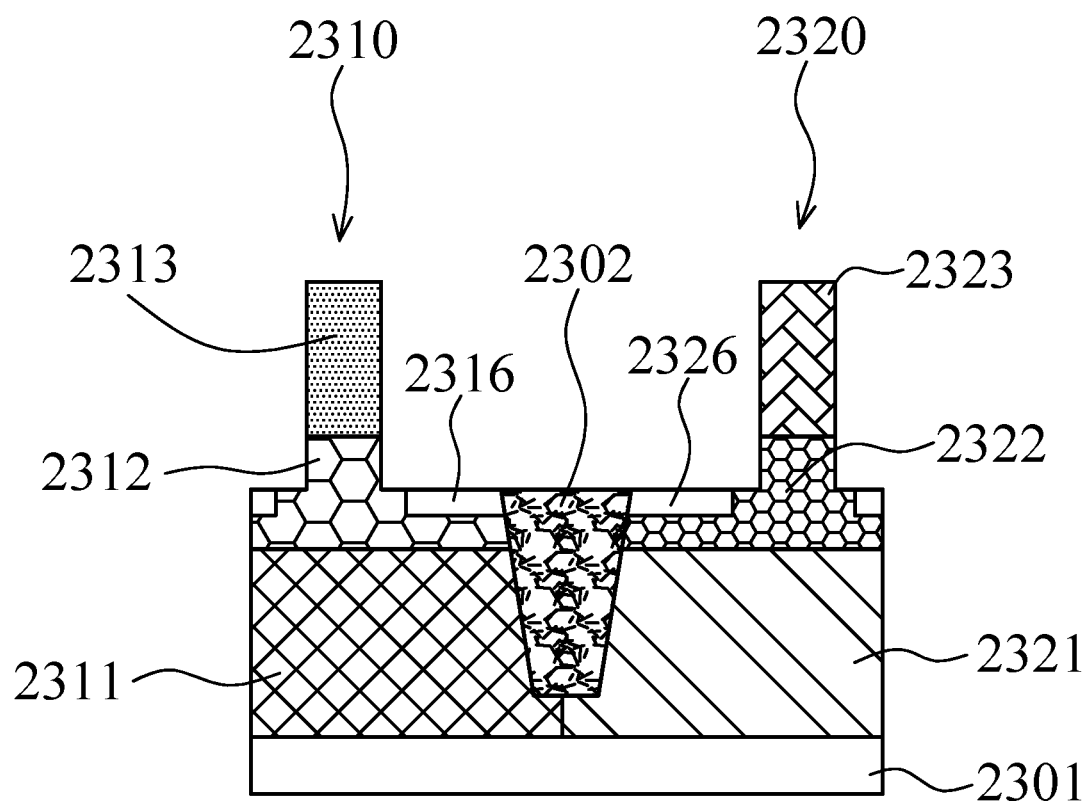
FIG. 23 is a sectional view illustrating an exemplary semiconductor device according to an exemplary embodiment.

FIG. 23 is a sectional view illustrating an exemplary semiconductor device according to an exemplary embodiment. As shown in FIG. 23, a semiconductor device 2300 is provided. In the semiconductor device 2300, a first vertical structure 2310 and a second vertical structure 2320 are provided over a substrate 2301. The first vertical structure 2310 and the second vertical structure 2320 may be vertical-gate-all-around devices electrically isolated by a shallow trench isolation 2302. The first vertical structure 2310 may be a PMOS, and may include an n-well 2311, a first source 2312 and a first channel 2313. The second vertical structure 2320 may be a NMOS, and may include a p-well 2321, a second source 2322 and a second channel 2323. Salicides 2316, 2326 are used to reduce contact resistance.

The first source 2312 may be disposed over the n-well 2311. The first channel 2313 may be disposed over the first source 2312. The second source 2322 may be disposed over the p-well 2321. The second channel 2323 may be disposed over the second source 2322. The following procedures may be performed on the first vertical structure 2310 and the second vertical structure 2320, and the details for the second vertical structure 2320 is not repeated herein.

Figure 24:
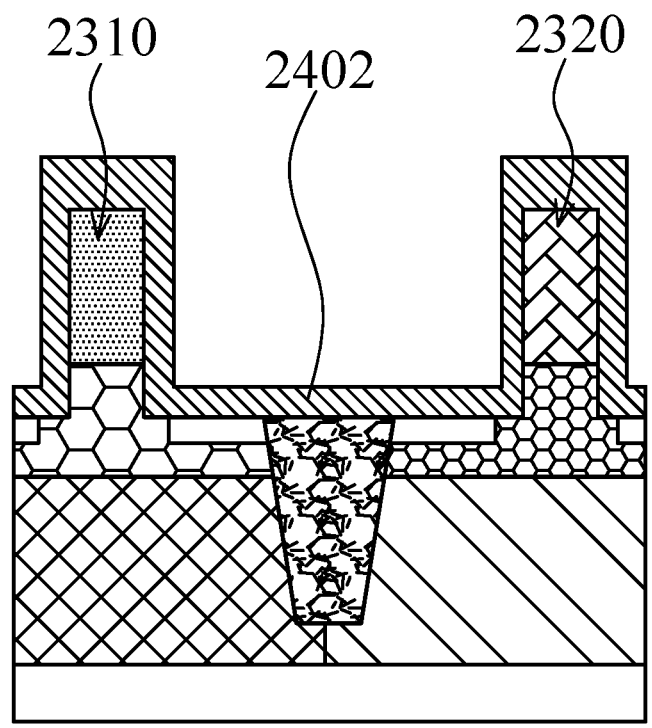
FIG. 24 is a sectional view illustrating the exemplary semiconductor device according to the exemplary embodiment.

FIG. 24 is a sectional view illustrating the exemplary semiconductor device according to the exemplary embodiment. As shown in FIG. 24, an etch stop layer 2402 is formed over the first vertical structure 2310 and the second vertical structure 2320. The etch stop layer 2402 may be formed of SiN. The etch stop layer 2402 may have a thickness of about 5-40 nanometers.

Figure 25:
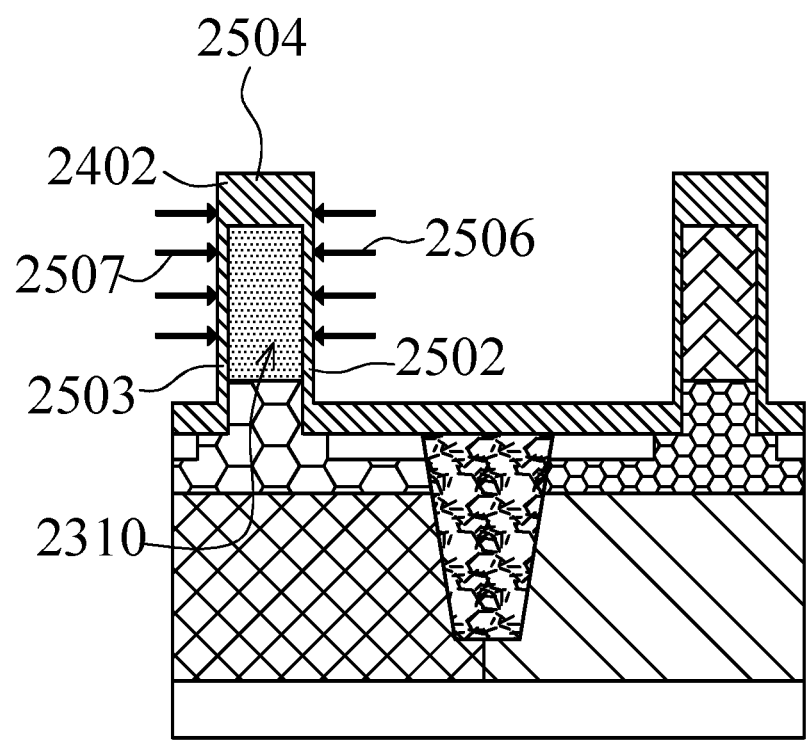
FIG. 25 is a sectional view illustrating the exemplary semiconductor device according to the exemplary embodiment.

FIG. 25 is a sectional view illustrating the exemplary semiconductor device according to the exemplary embodiment. As shown in FIG. 25, sidewalls 2502, 2503 of the etch stop layer 2402 are trimmed by a lateral etching process. In the lateral etching process, a polymer layer (not shown) may be formed over the portion 2504 of the etch stop layer 2402 above the top of the first vertical structure 2310 by using a polymer gas, and the sidewalls 2502, 2503 of the etch stop layer 2402 are respectively laterally etched with lateral plasma power 2506, 2507.

Figure 26:
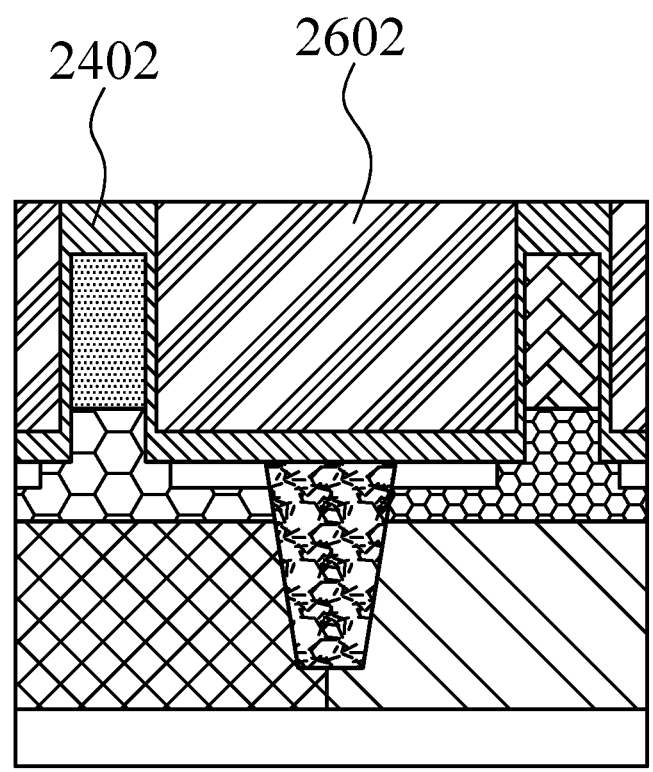
FIG. 26 is a sectional view illustrating the exemplary semiconductor device according to the exemplary embodiment.

FIG. 26 is a sectional view illustrating the exemplary semiconductor device according to the exemplary embodiment. As shown in FIG. 26, a first oxide layer 2602 is formed over the etch stop layer 2402. Then, a chemical mechanical polishing is performed on the first oxide layer 2602 and stops on the etch stop layer 2402.

Figure 27:
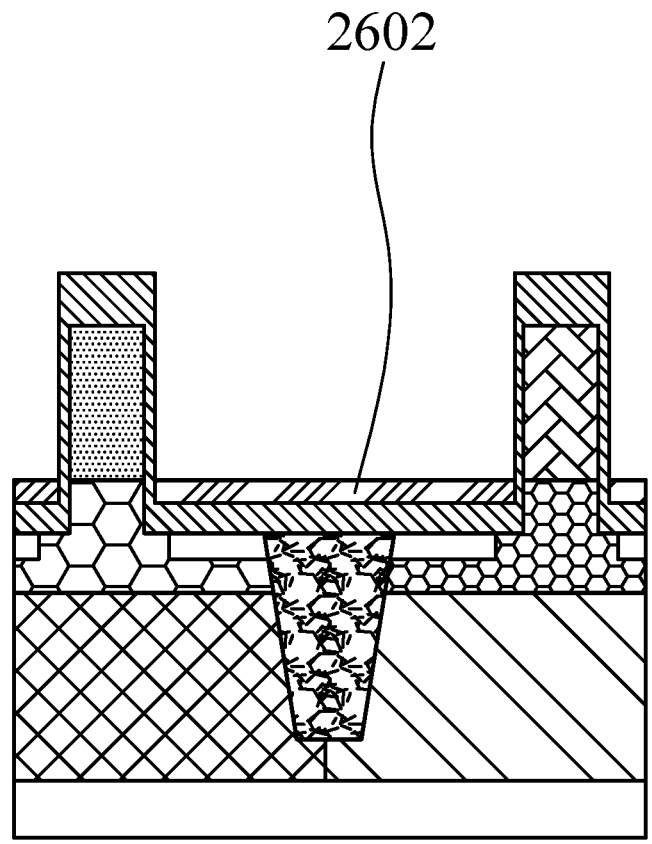
FIG. 27 is a sectional view illustrating the exemplary semiconductor device according to the exemplary embodiment.

FIG. 27 is a sectional view illustrating the exemplary semiconductor device according to the exemplary embodiment. As shown in FIG. 27, a dry etching back process is performed on the first oxide layer 2602. The remaining portion of the first oxide layer 2602 is used as a bottom isolation layer.

Figure 28:
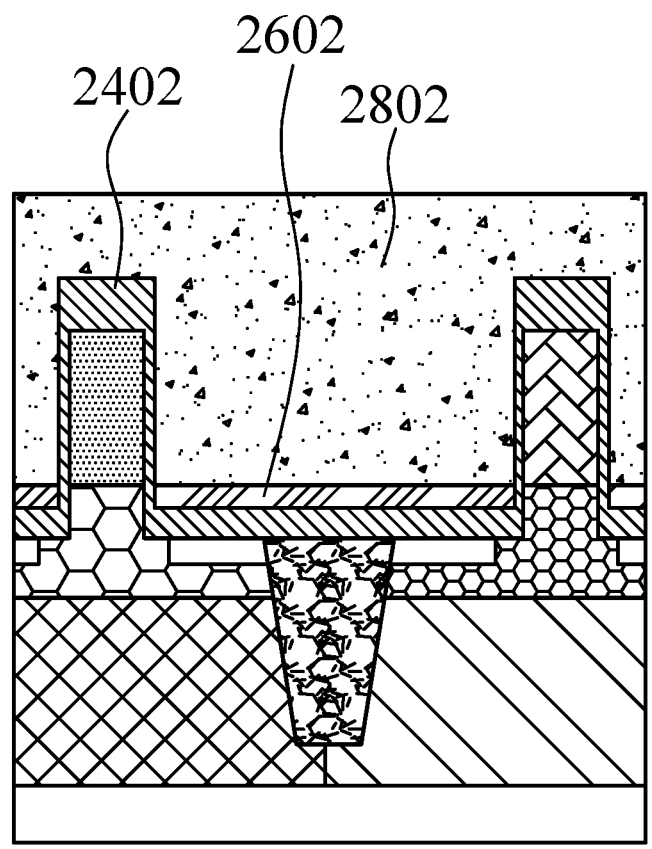
FIG. 28 is a sectional view illustrating the exemplary semiconductor device according to the exemplary embodiment.

FIG. 28 is a sectional view illustrating an exemplary semiconductor device according to an exemplary embodiment. As shown in FIG. 28, a first film layer 2802 is formed over the first oxide layer 2602 and the etch stop layer 2402. The first film layer 2802 may be formed of at least one of poly and an ashable amorphous carbon film.

Figure 29:
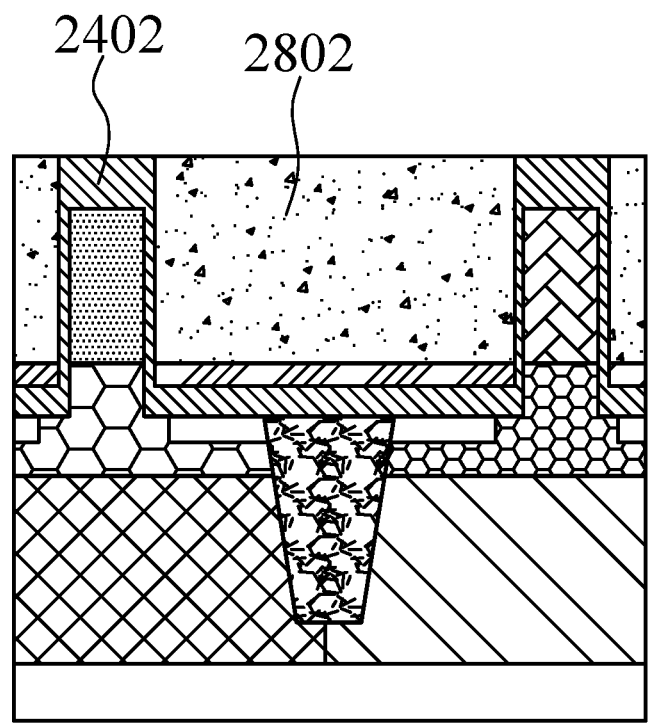
FIG. 29 is a sectional view illustrating the exemplary semiconductor device according to the exemplary embodiment.

FIG. 29 is a sectional view illustrating the exemplary semiconductor device according to the exemplary embodiment. As shown in FIG. 29, a chemical mechanical polishing is performed on the first film layer 2802 and stops on the etch stop layer 2402.

Figure 30:
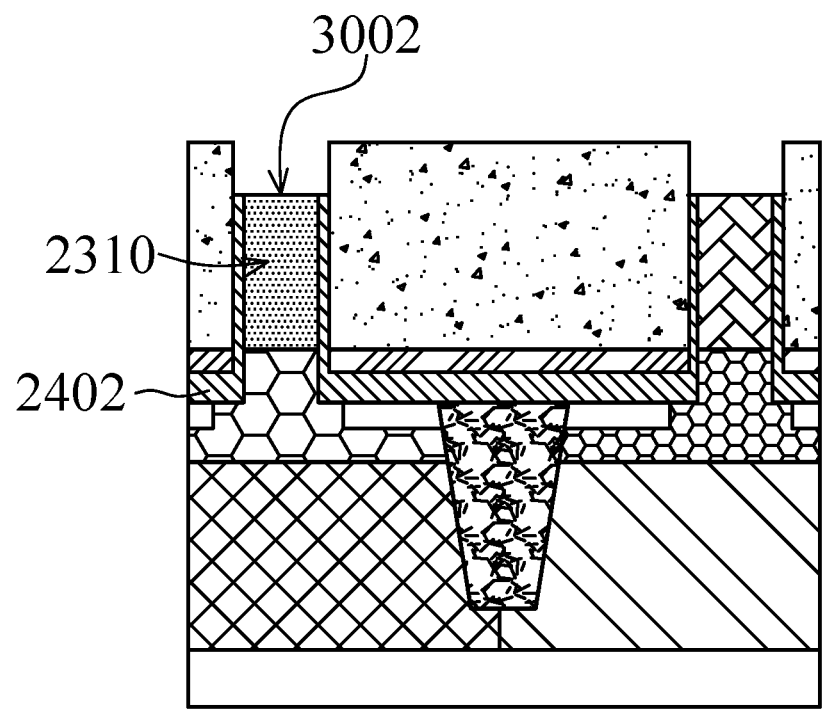
FIG. 30 is a sectional view illustrating the exemplary semiconductor device according to the exemplary embodiment.

FIG. 30 is a sectional view illustrating the exemplary semiconductor device according to the exemplary embodiment. As shown in FIG. 30, a wet etching process is performed on a portion of the etch stop layer 2402 to expose a top surface 3002 of the first vertical structure 2310.

Figure 31:
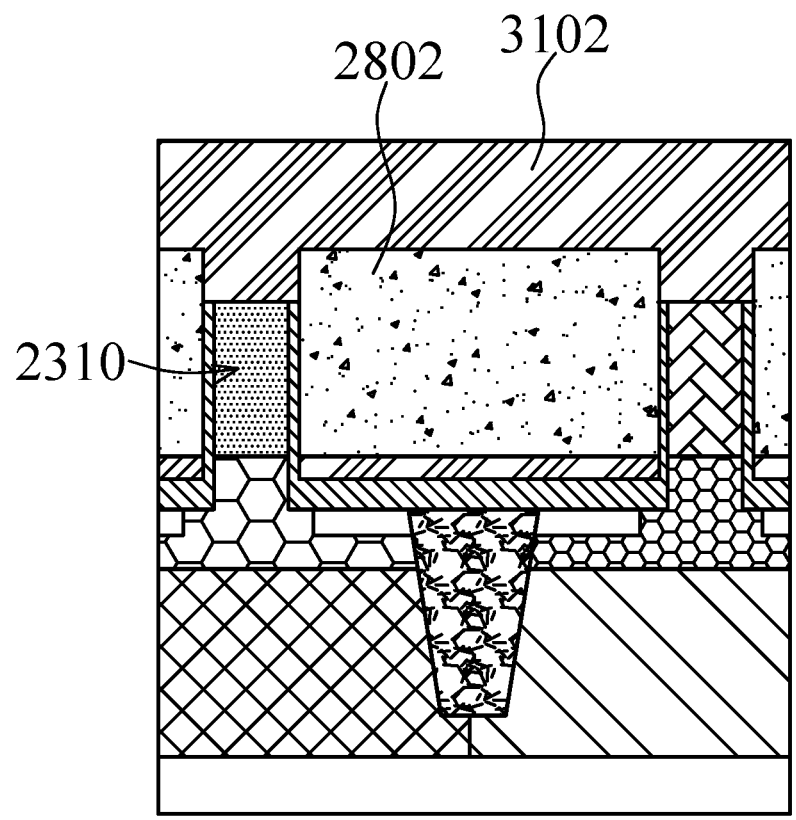
FIG. 31 is a sectional view illustrating the exemplary semiconductor device according to the exemplary embodiment.

FIG. 31 is a sectional view illustrating the exemplary semiconductor device according to the exemplary embodiment. As shown in FIG. 31, a second oxide layer 3102 is formed over the first film layer 2802 and the first vertical structure 2310.

Figure 32:
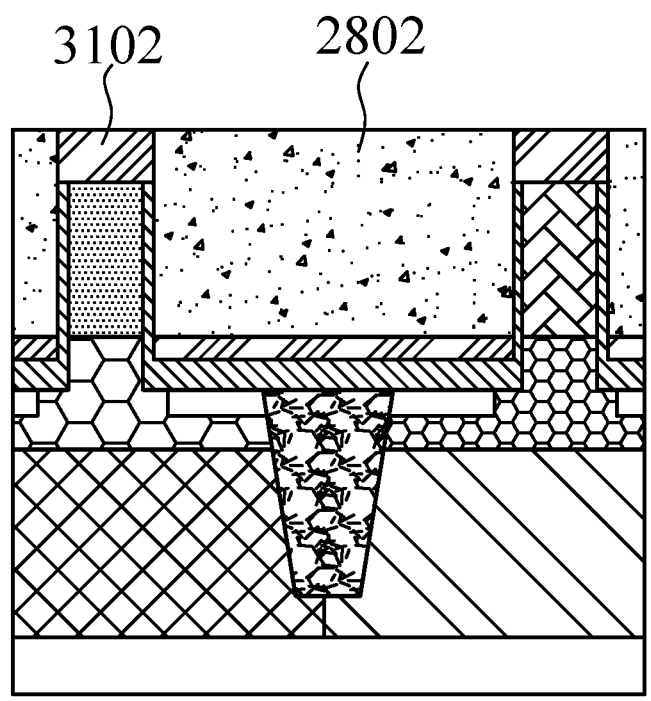
FIG. 32 is a sectional view illustrating the exemplary semiconductor device according to the exemplary embodiment.

FIG. 32 is a sectional view illustrating the exemplary semiconductor device according to the exemplary embodiment. As shown in FIG. 32, a chemical mechanical polishing is performed on the second oxide layer 3102 and stops on the first film layer 2802.

Figure 33:
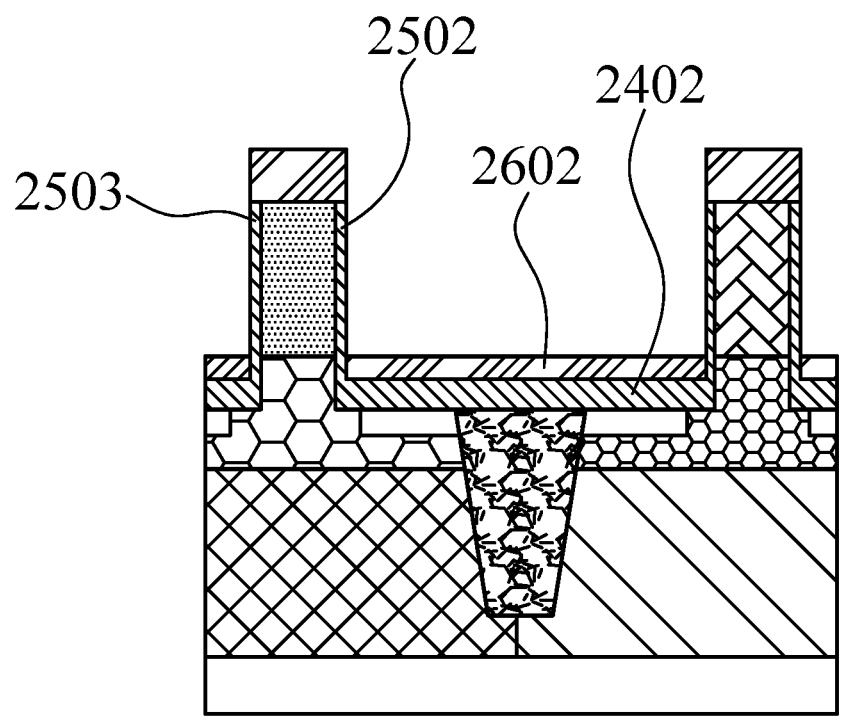
FIG. 33 is a sectional view illustrating the exemplary semiconductor device according to the exemplary embodiment.

FIG. 33 is a sectional view illustrating the exemplary semiconductor device according to the exemplary embodiment. As shown in FIG. 33, a wet etching process is performed on the first film layer (not shown) to expose the sidewalls 2502, 2503 of the etch stop layer 2402 and the first oxide layer 2602.

Figure 34:
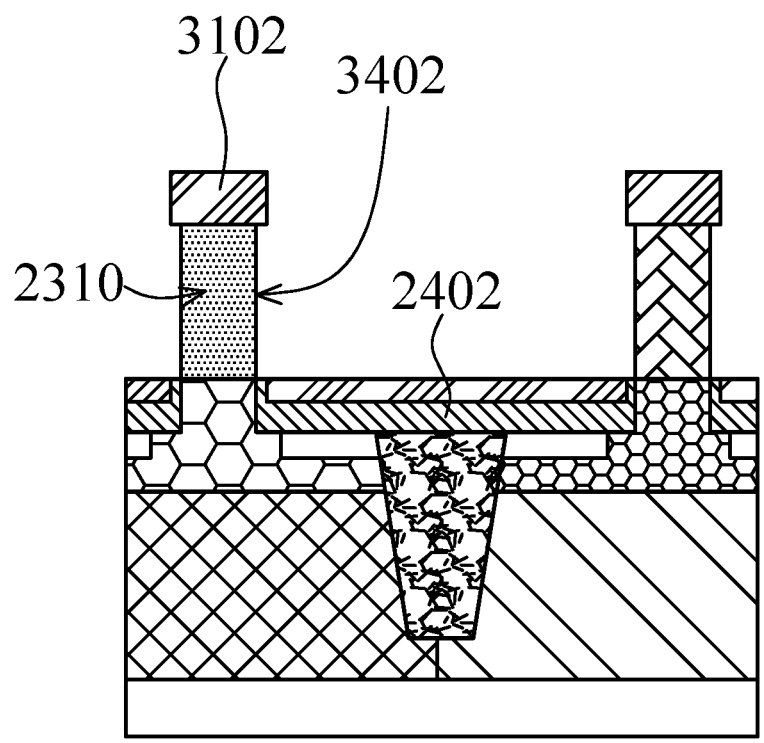
FIG. 34 is a sectional view illustrating the exemplary semiconductor device according to the exemplary embodiment.

FIG. 34 is a sectional view illustrating the exemplary semiconductor device according to the exemplary embodiment. As shown in FIG. 34, a wet etching process is performed on the sidewalls (not shown) of the etch stop layer 2402 to expose the lateral surface 3402 of the vertical structure 2310. As such, the second oxide layer 3102 is formed on the top of the vertical structure 2310. The second oxide layer 3102 is self-aligned to the vertical structure 2310 and may be formed as a hard mask on the top of the vertical structure 2310 to protect underlying layers for subsequent processes, for example, forming and patterning work function metal layers or metal gate layers. Furthermore, by using a proper etchant, the hard mask may be easily removed by a wet etching process.

Figure 35:
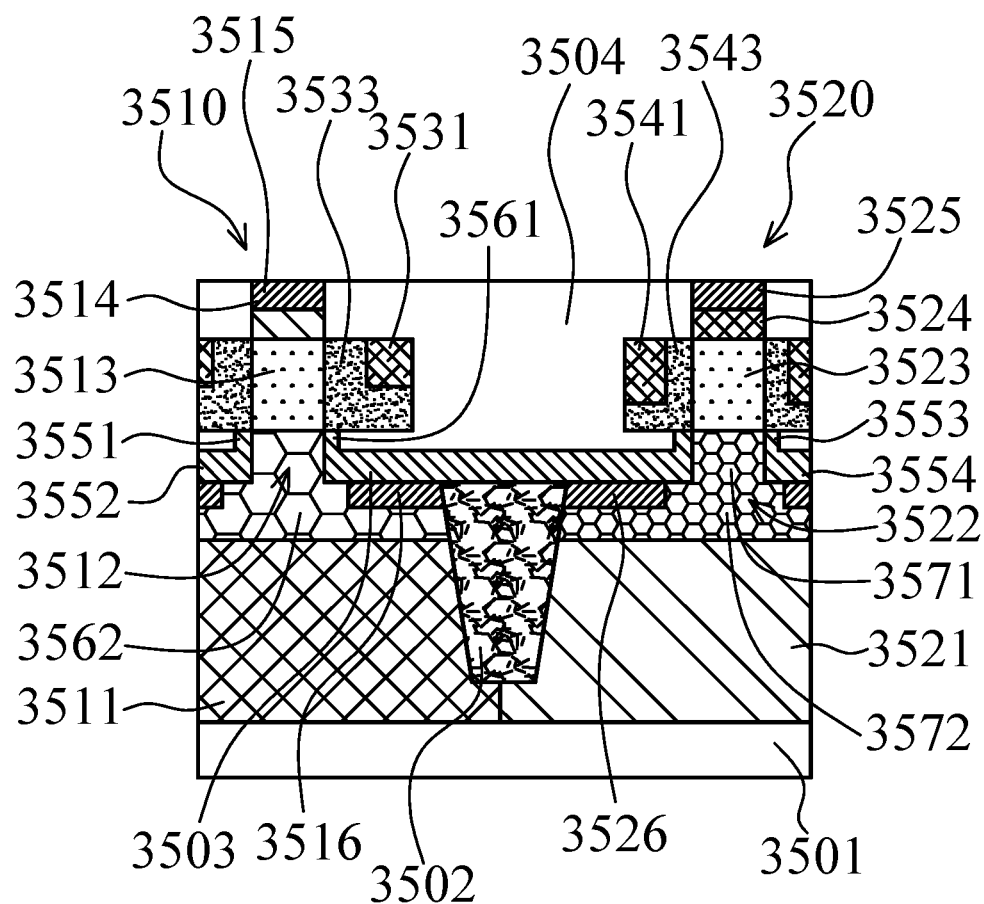
FIG. 35 is a sectional view illustrating an exemplary semiconductor device according to an exemplary embodiment.

FIG. 35 is a sectional view illustrating an exemplary semiconductor device according to an exemplary embodiment. As shown in FIG. 35, a chip 3500 is provided. In the chip 3500, a first vertical device 3510 having a first threshold and a second vertical device 3520 having a second threshold are provided over a substrate 3501. The first vertical device 3510 and the second vertical device 3520 may be electrically isolated by a shallow trench isolation 3502. The first vertical device 3510 may be a PMOS, and may include a n-well 3511, a first source 3512, a first channel 3513, a first drain 3514, a first gate 3531 and a first high-k dielectric layer 3533. The second vertical device 3520 may be a NMOS and may include a p-well 3521, a second source 3522, a second channel 3523, a second drain 3524, a second gate 3541 and a second high-k dielectric layer 3543. Salicides 3515, 3516, 3525, 3526 are used to reduce contact resistance.

The first source 3512 may be disposed over the n-well 3511. The first channel 3513 may be disposed over the first source 3512. The first drain 3514 may be disposed over the first channel 3513. The second source 3522 may be disposed over the p-well 3521. The second channel 3523 may be disposed over the second source 3522. The second drain 3524 may be disposed over the second channel 3523. A silicon nitride layer 3503 as an insulator may be disposed over the first source 3512, the second source 3522 and the shallow trench isolation 3502. An oxide layer 3504 may be disposed over the silicon nitride layer 3503.

The first high-k dielectric layer 3533 may be disposed between the first gate 3531 and the first channel 3513, and the second high-k dielectric layer 3543 may be disposed between the second gate 3541 and the second channel 3523.

For the first vertical device 3510, the first source 3512 has a first protrusion 3561 and a first base 3562. A first trimmed portion 3551 of the silicon nitride layer 3503 is adjacent to the first protrusion 3561. A first untrimmed portion 3552 of the silicon nitride layer 3503 is formed over the first base 3562. The first channel 3513 is formed over the first protrusion 3561 of the first source 3512. The first drain 3514 is formed over the first channel 3513.

For the second vertical device 3520, the second source 3522 has a second protrusion 3571 and a second base 3572. A second trimmed portion 3553 of the silicon nitride layer 3554 is adjacent to the second protrusion 3571. A second untrimmed portion 3554 of the silicon nitride layer 3503 is formed over the second base 3572. The second channel 3523 is formed over the second protrusion 3571 of the second source 3522. The second drain 3524 is formed over the second channel 3523.

Figure 36:
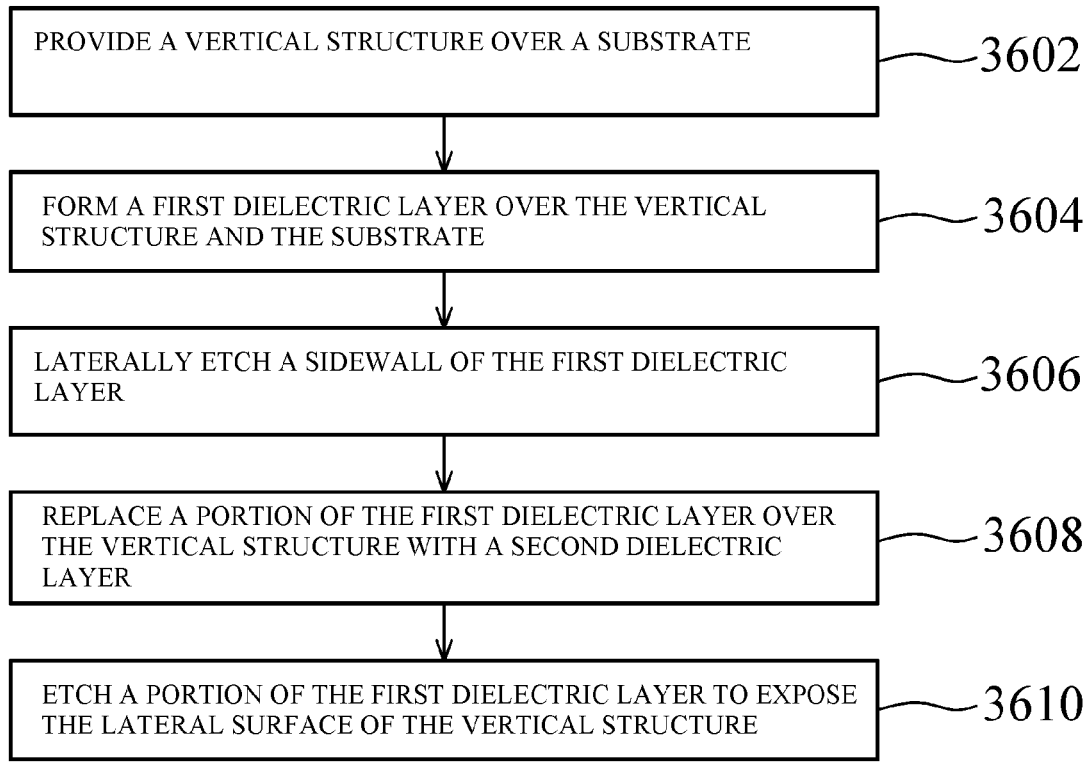
FIG. 36 is a flow chart for forming a vertical device according to an exemplary embodiment.

FIG. 36 is a flow chart for forming a vertical device according to an exemplary embodiment. As shown in FIG. 36, a method 3600 is provided. The method 3600 includes the following operations: providing a vertical structure over a substrate (3602); forming a first dielectric layer over the vertical structure and the substrate (3604); laterally etching a sidewall of the first dielectric layer (3606); replacing a portion of the first dielectric layer over the vertical structure with a second dielectric layer (3608); and etching a portion of the first dielectric layer to expose the lateral surface of the vertical structure (3610).

The operation 3608 of replacing the portion of the first dielectric layer over the vertical structure with the second dielectric layer may further include the following operations: forming a first film layer over the first dielectric layer; performing chemical mechanical polishing on the first film layer and stopping on the first dielectric layer; etching a portion of the first dielectric layer to expose a top surface of the vertical structure and to form a recess; forming the second dielectric layer over the first film layer and in the recess; performing chemical mechanical polishing on the second dielectric layer and stopping on the first film layer; and etching the first film layer. The operation of forming the first film layer over the first dielectric layer may include: forming the first film layer with at least one of poly and an ashable amorphous carbon film. The operation of forming the second dielectric layer over the first film layer and in the recess may include: forming the second dielectric layer with at least one of oxide, SiN, SiON, SiC, SiCN and SiOCN.

In the exemplary embodiment, the method 3600 may include: forming a third dielectric layer over the substrate. In the exemplary embodiment, the operation 3606 of laterally etching the sidewall of the first dielectric layer may further include: forming a polymer layer over a portion of the first dielectric layer above a top of the vertical structure by using a polymer gas; and laterally etching the sidewall of the first dielectric layer by using a plasma etching process with a lateral power.

In the exemplary embodiment, the operation 3604 of forming the first dielectric layer over the vertical structure and the substrate further comprises: forming the first dielectric layer with at least one of oxide, SiN, SiON, SiC, SiCN and SiOCN. In the exemplary embodiment, the operation 3604 of forming the first dielectric layer over the vertical structure and the substrate further comprises: forming the first dielectric layer having a thickness of 5-40 nanometers.

In the exemplary embodiment, the operation 3602 of providing the vertical structure over the substrate may include: providing the vertical structure having a source layer and a channel layer. In the exemplary embodiment, the operation 3604 of providing the vertical structure over the substrate may include: providing the vertical structure having a source layer, a drain layer and a channel layer.

Figure 37:
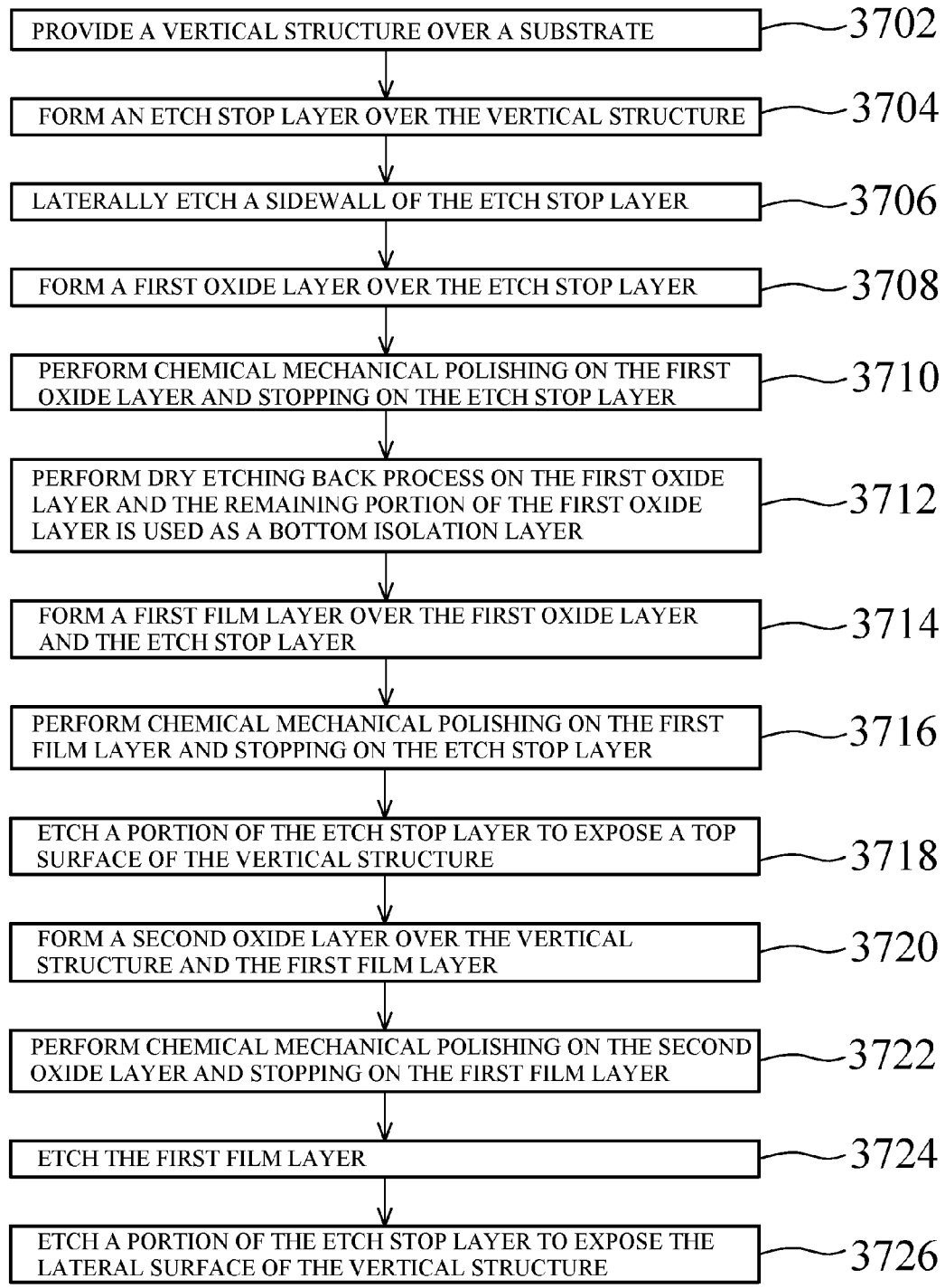
FIG. 37 is a flow chart for forming a vertical device according to an exemplary embodiment.

FIG. 37 is a flow chart for forming a vertical device according to an exemplary embodiment. As shown in FIG. 37, a method 3700 is provided. The method 3700 includes the following operations: providing a vertical structure over a substrate (3702); forming an etch stop layer over the vertical structure (3704); laterally etching a sidewall of the etch stop layer (3706); forming a first oxide layer over the etch stop layer (3708); performing chemical mechanical polishing on the first oxide layer and stopping on the etch stop layer (3710); performing dry etching back process on the first oxide layer and the remaining portion of the first oxide layer being used as a bottom isolation layer (3712); forming a first film layer over the first oxide layer and the etch stop layer (3714); performing chemical mechanical polishing on the first film layer and stopping on the etch stop layer (3716); etching a portion of the etch stop layer to expose a top surface of the vertical structure (3718); forming a second oxide layer over the vertical structure and the first film layer (3720); performing chemical mechanical polishing on the second oxide layer and stopping on the first film layer (3722); etching the first film layer (3724); and etching a portion of the etch stop layer to expose the lateral surface of the vertical structure (3726).

In the exemplary embodiment, the operation 3706 of laterally etching the sidewall of the etch stop layer may include: forming a polymer layer over a portion of the etch stop layer above the top of the vertical structure by using a polymer gas; and laterally etching the sidewall of the etch stop layer by using a plasma etching process with a lateral power. In the exemplary embodiment, the operation 3704 of forming the etch stop layer over the vertical structure may include: forming the etch stop layer with SiN.

In the exemplary embodiment, the operation 3712 of forming the first film layer over the first oxide layer and the etch stop layer may include: forming the first film layer with at least one of poly and ashable amorphous carbon film. In the exemplary embodiment, the operation 3704 of forming the etch stop layer over the vertical structure may include: forming the etch stop layer having a thickness of 5-40 nanometers.

In the exemplary embodiment, the operation 3702 of providing the vertical structure over the substrate may include: providing the vertical structure having a source layer and a channel layer. In the exemplary embodiment, the operation 3702 of providing the vertical structure over the substrate may include: providing the vertical structure having a source layer, a drain layer and a channel layer.

According to an exemplary embodiment, a method of forming a vertical device is provided. The method comprises: providing a protrusion over a substrate; forming an etch stop layer over the protrusion; laterally etching a sidewall of the etch stop layer; forming an insulating layer over the etch stop layer; forming a film layer over the insulating layer and the etch stop layer; performing chemical mechanical polishing on the film layer and exposing the etch stop layer; etching a portion of the etch stop layer to expose a top surface of the protrusion; forming an oxide layer over the protrusion and the film layer; and performing chemical mechanical polishing on the oxide layer and exposing the film layer.

According to an exemplary embodiment, a method of forming a vertical device is provided. The method comprises: providing a protrusion over a substrate; forming an etch stop layer over the protrusion; laterally etching a sidewall of the etch stop layer; forming an insulating layer over the etch stop layer; forming a film layer over the insulating layer and the etch stop layer with at least one of poly and ashable amorphous carbon film; performing chemical mechanical polishing on the film layer and stopping on the etch stop layer; etching a portion of the etch stop layer to expose a top surface of the protrusion; forming an oxide layer over the protrusion and the film layer; and performing chemical mechanical polishing on the oxide layer and stopping on the film layer.

According to an exemplary embodiment, a vertical device is provided. The vertical device includes a source layer, first and second layers, a channel layer, and a drain layer. The source layer has a protrusion and a base. The first layer is adjacent to the protrusion. The second layer is over the base of the source layer and has a larger thickness than the first layer. The channel layer is over the protrusion of the source layer. The drain layer is over the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a vertical device, comprising:
providing a protrusion over a substrate;
forming an etch stop layer over the protrusion;
laterally etching a sidewall of the etch stop layer;
forming an insulating layer over the etch stop layer;
forming a film layer over the insulating layer and the etch stop layer;
performing chemical mechanical polishing on the film layer and exposing the etch stop layer;
etching a portion of the etch stop layer to expose a top surface of the protrusion;
forming an oxide layer over the protrusion and the film layer; and
performing chemical mechanical polishing on the oxide layer and exposing the film layer.

2. The method of claim 1, wherein laterally etching the sidewall of the etch stop layer further comprises:
forming a polymer layer over a portion of the etch stop layer above the top of the protrusion by using a polymer gas; and
laterally etching the sidewall of the etch stop layer by using a plasma etching process with a lateral power.

3. The method of claim 1, wherein forming the etch stop layer over the protrusion further comprises forming the etch stop layer with SiN.

4. The method of claim 1, further comprising: etching the film layer; and etching a portion of the etch stop layer to expose the lateral surface of the protrusion.

5. The method of claim 1, wherein forming the etch stop layer over the protrusion further comprises forming the etch stop layer having a thickness of 5-40 nanometers.

6. The method of claim 1, wherein providing the protrusion over the substrate further comprises providing the protrusion having a source layer and a channel layer.

7. The method of claim 1, wherein providing the protrusion over the substrate further comprises providing the protrusion having a source layer, a drain layer, and a channel layer.

8. The method of claim 1, wherein forming the insulating layer over the etch stop layer further comprises forming the insulating layer over the etch stop layer by using at least one of oxide, SiN, SiON, SiC, SiCN and SiOCN.

9. The method of claim 1, wherein forming the oxide layer over the protrusion and the film layer further comprises forming the oxide layer over the protrusion and the film layer by using at least one of oxide, SiN, SiON, SiC, SiCN and SiOCN.

10. The method of claim 1, wherein forming the insulating layer over the etch stop layer further comprises: performing chemical mechanical polishing on the insulating layer and stopping on the etch stop layer; and etching back the insulating layer.

11. A method of forming a vertical device, comprising:
providing a protrusion over a substrate;
forming an etch stop layer over the protrusion;
laterally etching a sidewall of the etch stop layer;
forming an insulating layer over the etch stop layer;
forming a film layer over the insulating layer and the etch stop layer with at least one of poly and ashable amorphous carbon film;
performing chemical mechanical polishing on the film layer and stopping on the etch stop layer;
etching a portion of the etch stop layer to expose a top surface of the protrusion;
forming an oxide layer over the protrusion and the film layer; and
performing chemical mechanical polishing on the oxide layer and stopping on the film layer.

12. The method of claim 11, wherein laterally etching the sidewall of the etch stop layer further comprises:
forming a polymer layer over a portion of the etch stop layer above the top of the protrusion by using a polymer gas; and
laterally etching the sidewall of the etch stop layer by using a plasma etching process with a lateral power.

13. The method of claim 11, further comprising: etching the film layer; and etching a portion of the etch stop layer to expose the lateral surface of the protrusion.

14. The method of claim 11, wherein forming the etch stop layer over the protrusion further comprises forming the etch stop layer having a thickness of 5-40 nanometers.

15. The method of claim 11, wherein providing the protrusion over the substrate further comprises providing the protrusion having a source layer and a channel layer.

16. The method of claim 11, wherein providing the protrusion over the substrate further comprises providing the protrusion having a source layer, a drain layer and a channel layer.

17. The method of claim 11, wherein forming the insulating layer over the etch stop layer further comprises forming the insulating layer over the etch stop layer by using at least one of oxide, SiN, SiON, SiC, SiCN and SiOCN.

18. The method of claim 11, wherein forming the oxide layer over the protrusion and the film layer further comprises forming the oxide layer over the protrusion and the film layer by using at least one of oxide, SiN, SiON, SiC, SiCN and SiOCN.

19. The method of claim 11, wherein forming the insulating layer over the etch stop layer further comprises: performing chemical mechanical polishing on the insulating layer and stopping on the etch stop layer; and etching back the insulating layer.

20. A method of forming a vertical device, comprising:
providing a protrusion over a substrate;
forming an etch stop layer over the protrusion;
laterally etching a sidewall of the etch stop layer;
forming a dielectric layer over the etch stop layer;
forming a film layer over the dielectric layer and the etch stop layer;
performing chemical mechanical polishing on the film layer and stopping on the etch stop layer;
etching a portion of the etch stop layer to expose a top surface of the protrusion;
forming an oxide layer over the protrusion and the film layer; and
performing chemical mechanical polishing on the oxide layer and stopping on the film layer.

* * * * *